(12) United States Patent
Wang et al.

(10) Patent No.: US 11,222,950 B2
(45) Date of Patent: Jan. 11, 2022

(54) METHOD FOR FABRICATING EMBEDDED NANOSTRUCTURES WITH ARBITRARY SHAPE

(71) Applicants: National Technology & Engineering Solutions of Sandia, LLC, Albuquerque, NM (US); University of Florida Research Foundation, Incorporated, Gainesville, FL (US)

(72) Inventors: George T. Wang, Albuquerque, NM (US); Keshab R. Sapkota, Albuquerque, NM (US); Kevin S. Jones, Archer, FL (US); Emily M. Turner, Gainesville, FL (US)

(73) Assignees: National Technology & Engineering Solutions of Sandia, LLC, Albuquerque, NM (US); University of Florida Research Foundation, Incorporated, Gainesville, FL (US)

( * ) Notice: Subject to any disclaimer, the term of this patent is extended or adjusted under 35 U.S.C. 154(b) by 17 days.

(21) Appl. No.: 16/852,763

(22) Filed: Apr. 20, 2020

(65) Prior Publication Data

US 2020/0365689 A1 Nov. 19, 2020

Related U.S. Application Data

(60) Provisional application No. 62/837,945, filed on Apr. 24, 2019.

(51) Int. Cl.
*H01L 29/06* (2006.01)
*H01L 21/02* (2006.01)
(Continued)

(52) U.S. Cl.
CPC .... *H01L 29/0676* (2013.01); *H01L 21/02532* (2013.01); *H01L 21/02603* (2013.01);
(Continued)

(58) Field of Classification Search
CPC .......... H01L 29/0676; H01L 21/02603; H01L 21/02532; H01L 33/08; H01L 33/06;
(Continued)

(56) References Cited

U.S. PATENT DOCUMENTS

| | | | |
|---|---|---|---|
| 7,759,257 B2 * | 7/2010 | Linden | H01S 5/341 438/751 |
| 8,143,144 B2 | 3/2012 | Kawashima et al. | |

(Continued)

FOREIGN PATENT DOCUMENTS

| | | | |
|---|---|---|---|
| CN | 101226736 B | | 2/2019 |
| CN | 107293625 B | * | 2/2019 |

OTHER PUBLICATIONS

International Search Report and Written Opinion of the International Searching Authority dated Sep. 30, 2020, in International Application No. PCT/US2020/028929.

(Continued)

*Primary Examiner* — Edward Chin
(74) *Attorney, Agent, or Firm* — Kevin W. Bieg

(57) ABSTRACT

A layered heterostructure, comprising alternating layers of different semiconductors, wherein one of the atom species of one of the semiconductors has a faster diffusion rate along an oxidizing interface than an atom species of the other semiconductor at an oxidizing temperature, can be used to fabricate embedded nanostructures with arbitrary shape. The result of the oxidation will be an embedded nanostructure comprising the semiconductor having slower diffusing atom species surrounded by the semiconductor having the higher diffusing atom species. The method enables the fabrication of low- and multi-dimensional quantum-scale embedded nanostructures, such as quantum dots (QDs), toroids, and ellipsoids.

11 Claims, 10 Drawing Sheets

(51) Int. Cl.
*B82Y 30/00* (2011.01)
*B82Y 40/00* (2011.01)
*B82Y 10/00* (2011.01)

(52) U.S. Cl.
CPC .............. *B82Y 10/00* (2013.01); *B82Y 30/00* (2013.01); *B82Y 40/00* (2013.01)

(58) Field of Classification Search
CPC ..... H01L 33/18; H01L 33/34; H01L 33/0054; H01L 33/0058; H01L 21/02664; H01L 21/02612; H01L 29/068; H01L 29/165; H01L 29/7613; B82Y 30/00; B82Y 40/00; B82Y 10/00
See application file for complete search history.

(56) References Cited

U.S. PATENT DOCUMENTS

| | | | |
|---|---|---|---|
| 8,173,526 B2* | 5/2012 | Enicks | H01L 29/66431 |
| | | | 438/510 |
| 8,951,430 B2 | 2/2015 | Li et al. | |
| 9,985,101 B2* | 5/2018 | Hatem | H01L 29/66439 |
| 10,068,990 B2 | 9/2018 | Yin et al. | |
| 10,134,759 B2 | 11/2018 | Loubet et al. | |
| 10,411,096 B2 | 9/2019 | Hatem et al. | |
| 2011/0198569 A1* | 8/2011 | Malshe | B82Y 10/00 |
| | | | 257/15 |

OTHER PUBLICATIONS

Bakyan, M.O. et al., "Strain effects on three-dimensional, two-dimensional, and one-dimensional silicon logic devices: Predicting the future of strained silicon", Journal of Applied Physics 108( 2010), pp. 093716-1-093716-24; DOI:10.1063/1.3488635.

Brewer, W.M. et al., "Lateral Ge Diffusion During Oxidation of Si/SiGe Fins", Nano Lett., vol. 17 (2017), pp. 2159-2164; DOI: 10.1021/acs.nanolett.6b04407.

Dohnalova, K. et al., "Surface brightens up Si quantum dots: direct bandgap-like size-tunable emission", Light: Science & Applications , vol. (2, e47 2013), 6 pages; DOI.org/10.1038/lsa.2013.3.

Hellberg, P.-E. et al., "Oxidation of silicon-germanium alloys. II. A mathematical model", Journal of Applied Physics 82 (1997), pp. 5779-5787; DOI.org/10.1063/1.366444.

Van Weert, M.H.M et al., "Surround-gated vertical nanowire quantum dots", Applied Physics Letters, vol. 96 (2010), pp. 233112-1-233112-3; DOI.org/10.1063/1.3452346.

Vos, M. et al., "Selective amorphization of ion-bombarded SiGe strained-layer superlattices", Appl. Phys. Lett. vol. 58 (1991), pp. 951-953; DOI.org/10.1063/1.104488.

* cited by examiner

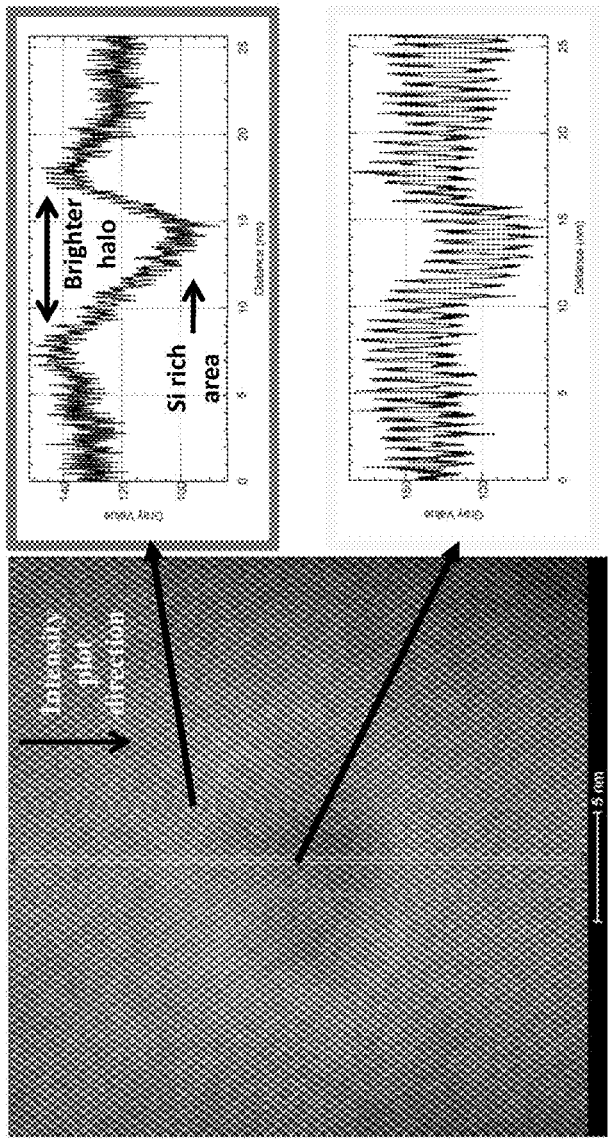

METHOD FOR FABRICATING EMBEDDED NANOSTRUCTURES WITH ARBITRARY SHAPE

CROSS-REFERENCE TO RELATED APPLICATION

This application claims the benefit of U.S. Provisional Application No. 62/837,945, filed Apr. 24, 2019, which is incorporated herein by reference.

STATEMENT OF GOVERNMENT INTEREST

This invention was made with Government support under Contract No. DE-NA0003525 awarded by the United States Department of Energy/National Nuclear Security Administration. The Government has certain rights in the invention.

FIELD OF THE INVENTION

The present invention relates to quantum-scale nanostructures and, in particular, to a method for fabricating embedded nanostructures with arbitrary shape.

BACKGROUND OF THE INVENTION

The next generation of silicon (Si) and silicon germanium (SiGe) microelectronics and optoelectronics, including low-power single-electron devices, spin qubits for quantum computing, on-chip light sources for integrated all-Si(Ge) based photonics/electronics, and nanoscale sensors, requires a scalable method to manufacture quantum-scale structures in the sub-10 nm size regime. However, current top-down lithographic and bottom-up synthesis approaches for making on-chip Si/SiGe-based nanostructures with control over size and placement are challenged by these extremely small dimensions. Recent work has revealed a previously undiscovered, extremely enhanced Ge diffusion process along Si/SiO$_2$ interfaces during thermal oxidation of Si/SiGe superlattice nanofins. This enhanced Ge diffusion enabled the formation of lateral Si nanowires embedded in SiGe cladding. Si nanowires with diameters down to 2 nm have been realized, thus opening a new approach for the fabrication of sub 10-nm diameter nanowires. See W. M. Brewer et al., *Nano Lett.* 17(4), 2159 (2017); and U.S. Pat. No. 9,985,101, issued May 29, 2018, both of which are incorporated herein by reference. Further, as these nanowires are encapsulated in single-crystal defect-free SiGe, strain-related properties, such as free carrier mobility, can potentially be manipulated in such structures.

SUMMARY OF THE INVENTION

The present invention is directed to a method for fabricating embedded nanostructures comprising: providing a layered heterostructure comprising alternating layers of at least two different semiconductors, wherein an atom species of one of the semiconductors has a faster diffusion rate along an oxidizing interface than a slower diffusing atom species of the other semiconductor at an oxidizing temperature; patterning the layered heterostructure to form a patterned heterostructure; removing portions of the patterned heterostructure to form vertical pillars; and oxidizing the vertical pillars at the oxidizing temperature to form embedded nanostructures of the semiconductor having the slower diffusing atom species surrounded by the semiconductor having the faster diffusing atom species. For example, the layered heterostructure can comprise binary/ternary semiconductor alloys, such as GaAs/AlGaAs or InAs/AlInAs, or elemental/binary semiconductors, such as Si/SiGe.

The Si/SiGe layered heterostructure can comprise at least one Si layer between SiGe layers, wherein the embedded nanostructure comprises a Si nanostructure surrounded by SiGe. The embedded Si nanostructure can be surrounded by a Ge-rich cladding. The method can further comprise implanting the surrounding SiGe with Si ions to amorphize the SiGe.

The oxidizing step can comprise exposing the vertical pillars to O$_2$ at an oxidizing temperature greater than 800° C. The method can further comprise annealing the embedded nanostructures at an annealing temperature to at least partially remove the surrounding semiconductor. The annealing step can comprise exposing the embedded nanostructures to O$_2$ at an annealing temperature (e.g., greater than 500° C. and less than 800° C.). The patterned heterostructure can comprises an arbitrary pattern, thereby providing an embedded nanostructure of arbitrary shape. For example, the patterned heterostructure can comprise a circle, square, rectangle, L, ring, or ellipsoid. The embedded nanostructure can have a cross-sectional dimension of less than 10 nm.

BRIEF DESCRIPTION OF THE DRAWINGS

The detailed description will refer to the following drawings, wherein like elements are referred to by like numbers.

FIG. 5A is a STEM image of the embedded Si dot. FIG. 5B is a greyscale intensity plot of the Si dot. FIG. 5C is a greyscale intensity plot across the center of the Si dot.

DETAILED DESCRIPTION OF THE INVENTION

The present invention is directed to a novel method for fabricating low- and multi-dimensional quantum-scale embedded nanostructures, such as quantum dots (QDs), toroids, and ellipsoids, from semiconductor layered heterostructures. In general, the method can be used with any layered heterostructure, comprising alternating layers of different semiconductors, wherein one of the atom species of one of the semiconductors has a faster diffusion rate along an oxidizing interface than an atom species of the other semiconductor at an oxidizing temperature. The result of the oxidation will be an embedded nanostructure comprising the semiconductor having the slower diffusing atom species surrounded by the semiconductor having the higher diffusing atom species. For example, the method can be used with GaAs/AlGaAs layered heterostructures to form GaAs nanostructures embedded in AlGaAs, InAs/AlInAs layered heterostructures to form InAs nanostructures embedded in AlInAs, and Si/SiGe layered heterostructures to form Si nanostructures embedded in SiGe.

As an example, the invention enables the controlled and scalable fabrication of on-chip Si/SiGe quantum-scale structures below 10 nm. These embedded nanostructures can exhibit unique and useful new properties. For example, the indirect bandgap of Si limits its usefulness as an optoelectronic material. However, at small enough sizes (e.g. <2.5 nm), Si nanowires have been theoretically predicted to transition from an indirect to a direct bandgap. See M. O. Baykan et al., *J. Appl. Phys.* 108(9), 1 (2010). Direct bandgap Si/SiGe quantum-scale structures may enable a host of integrated all Si(Ge)-based photonics, including on-chip optical sources for interconnects, which is a highly sought-after goal that could eliminate the current need for integrating III-V and Si(Ge) materials and devices. The fabrication of novel embedded nanostructures using the method of the present invention enables a wide range of unique morphologies for these and other future applications.

Figure 1A:
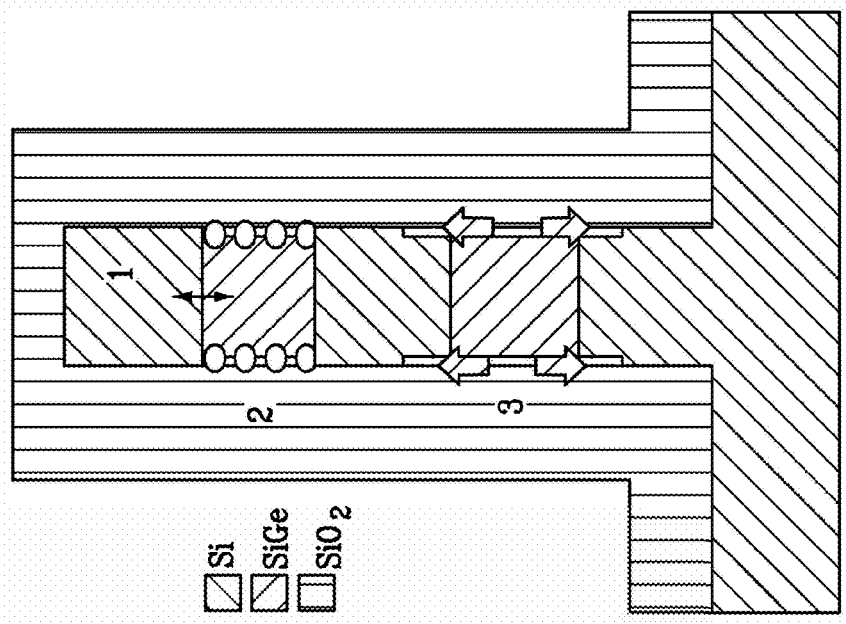
FIG. 1A is a schematic illustration of three diffusion processes responsible for embedded nanostructure formation during Si/SiGe fin oxidation: 1) conventional interdiffusion between Si and Ge, 2) Ge rejection into SiGe from an oxidizing interface, and 3) rapid oxidation-assisted Ge diffusion along the oxidizing interface.

There are three distinct diffusion-related processes hypothesized to be involved in the evolution of these oxidizing Si/SiGe nanostructures, illustrated in FIG. 1A. Process 1 indicates the interdiffusion of Si and Ge in bulk diffusion couples. This interdiffusion process is well understood. See R. Kube et al., *Mater. Sci. Semiconduct. Process.* 11(5), 378 (2008); R. Kube et al., *J. Appl. Phys.* 107, 1 (2010); G. L. McVay and A. R. DuCharme, *J. Appl. Phys.* 44, 1409 (1973); and M. Gavelle et al., *J. Appl. Phys.* 104, (2008). This interdiffusion controls the upper limit of the oxidation temperature, as excessive interdiffusion is undesirable and will lead to a non-abrupt interface between the Si and SiGe layers. Process 2 indicates the pile-up/snow plow effect of Ge during the oxidation of SiGe. This process is also well-studied, although questions on the exact mechanism remain. See E. Long et al., *J. Vac. Sci. Technol. B*, (2012); M. Tanaka et al., (2008); and S. Margalit et al., *J. Cryst. Growth*, 17, 288 (1972). Since the oxidation potential of Si is greater than Ge, the Si is selectively oxidized and the Ge is rejected back into the SiGe, producing a Ge-rich layer in the SiGe at the oxidizing SiGe/$SiO_2$ interface. The steady-state Ge concentration in this Ge rich layer is highly dependent on temperature and does not depend on the initial Ge concentration of the SiGe. Process 3 is an enhanced vertical Ge diffusion process along the oxidizing Si/$SiO_2$ interface. This diffusion is estimated to be at least two orders of magnitude faster than Ge diffusing through bulk crystalline Si. The mechanism or details of the formation of the initial SiGe layer along the oxidizing Si/$SiO_2$ interface is unknown. See W. M. Brewer et al., *Nano Lett.* 17(4), 2159 (2017).

Figure 1B:
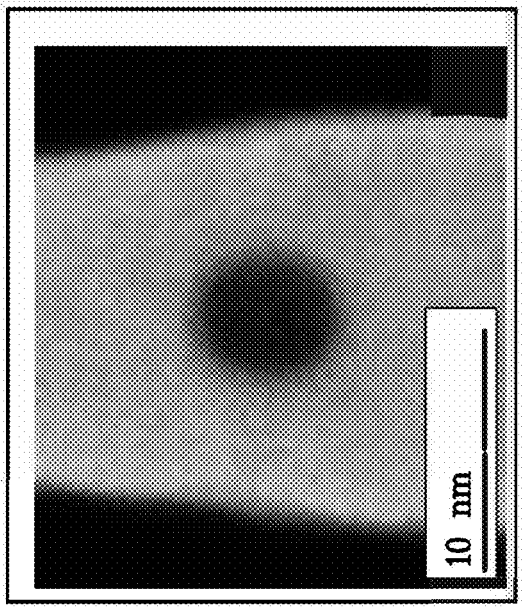
FIG. 1B is a schematic illustration the combination of these three processes in the formation of an embedded nanowire, with a higher Ge concentration shown as the unhatched boundary between the SiGe and SiO$_2$ regions.
Figure 1C:
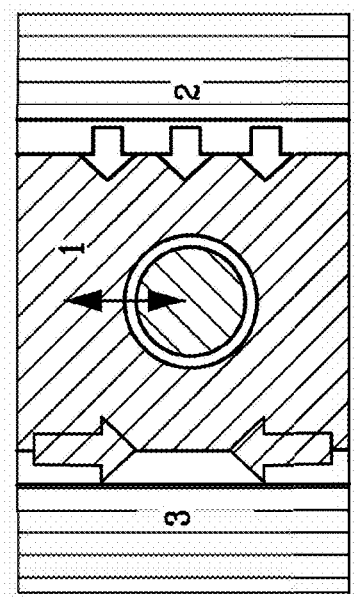
FIG. 1C is a cross-sectional scanning transmission electron microscopy (STEM) image of a 5.5 nm diameter Si nanowire (dark) embedded in single crystal SiGe (light) formed by the combination of these three processes during a 45-minute oxidation in dry O$_2$ at 900° C.

It is not well understood how each of these three diffusion processes contribute to the accumulation of Ge along the sides of the nanostructure. However, the interaction between these three combined processes in the oxidation of a Si/SiGe fin structure has been shown to form longitudinal strained Si single crystal nanowires encapsulated in SiGe with a rounded cross-section down to 2 nm. See W. M. Brewer et al., *Nano Lett.* 17(4), 2159 (2017). FIG. 1B is a schematic illustrating the combination of these three processes in the formation of a nanowire, with a higher Ge concentration shown as the unhatched boundary between the SiGe and $SiO_2$ regions. FIG. 1C shows a cross-sectional scanning transmission electron microscopy (STEM) image of a 5.5 nm diameter Si nanowire (dark) embedded in single crystal SiGe (light) formed by the combination of these three processes after a 45-minute oxidation in dry $O_2$ at 900° C.

These diffusion processes have competing activation energies, suggesting that the size and shape of the embedded nanostructures can be controlled by tuning the oxidation time and temperature and by the starting geometry. See P.-E. Hellberg et al., *J. Appl. Phys.* 82, 5779 (1997). If these processes can be predictably controlled, scalable, sub-10 nm nanostructure formation is possible. In particular, the enhanced Ge diffusion process can be exploited to create completely novel multi-dimensional quantum structures not easily realized or even possible using current top-down or bottom-up approaches. For example, quantum dots can have excellent optical quality and may allow for electron charging down to the single electron level. Finally, selective amorphization of the SiGe alloy surrounding the embedded Si nanostructure, via ion implantation, can provide a route to electronic confinement.

Figure 2:
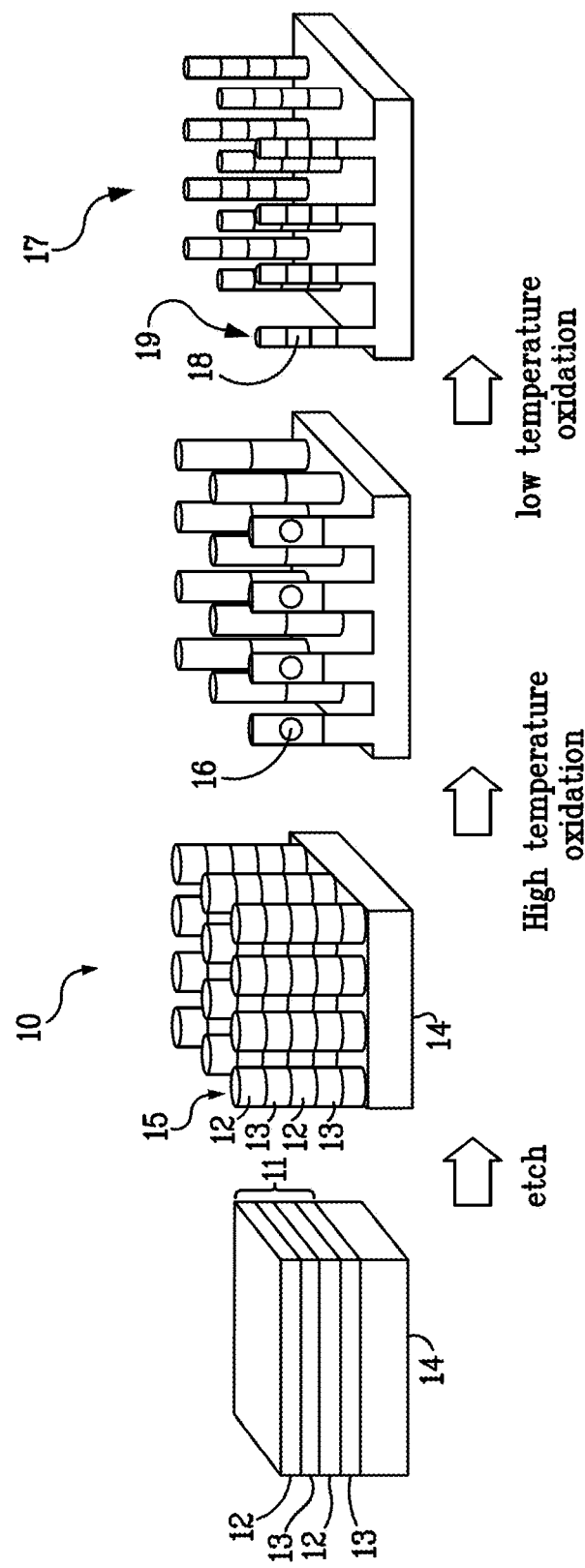
FIG. 2 is a schematic illustration of a method for fabricating Si or SiGe quantum dots in an array of vertical pillars or posts.

By creating a patterned, starting heterostructure with layers of differing composition, it is possible to shrink and embed the layer comprising the slower diffusing species, creating an embedded nanostructure with the shape and size determined by the starting layered structure shape and the thermal oxidation condition. In FIG. 2 is shown an exemplary method to fabricate OD structures (e.g., Si/SiGe quantum dots) in vertical pillars, or posts, enabled by the enhanced diffusion process. The process begins with depositing a layered Si/SiGe epitaxial heterostructure 11, comprising alternating layers of Si 12 and SiGe 13, on a substrate 14. In this example, the substrate 14 is Si. The layered heterostructure 11 can be patterned using e-beam lithography to define circular features. Next, an array 10 of vertical pillars 15 can be created in the patterned Si/SiGe heterostructure using reactive ion etching. The pillars 15 are preferably long enough to allow uninhibited Ge diffusion down the sidewalls and strong enough to maintain structural integrity during the subsequent processing steps. The pillars 15 can then be annealed under a high temperature oxidizing condition using rapid thermal oxidation (RTO) to form embedded Si dots 16. Finally, the SiGe sidewalls can be removed via a low temperature oxidizing anneal to form an array 17 of Si (or SiGe) quantum dots 18 in the oxidized pillars 19. The size of the quantum dots 18 can be controlled by the starting pillar 15 diameter and the annealing times and temperatures.

Figure 3:
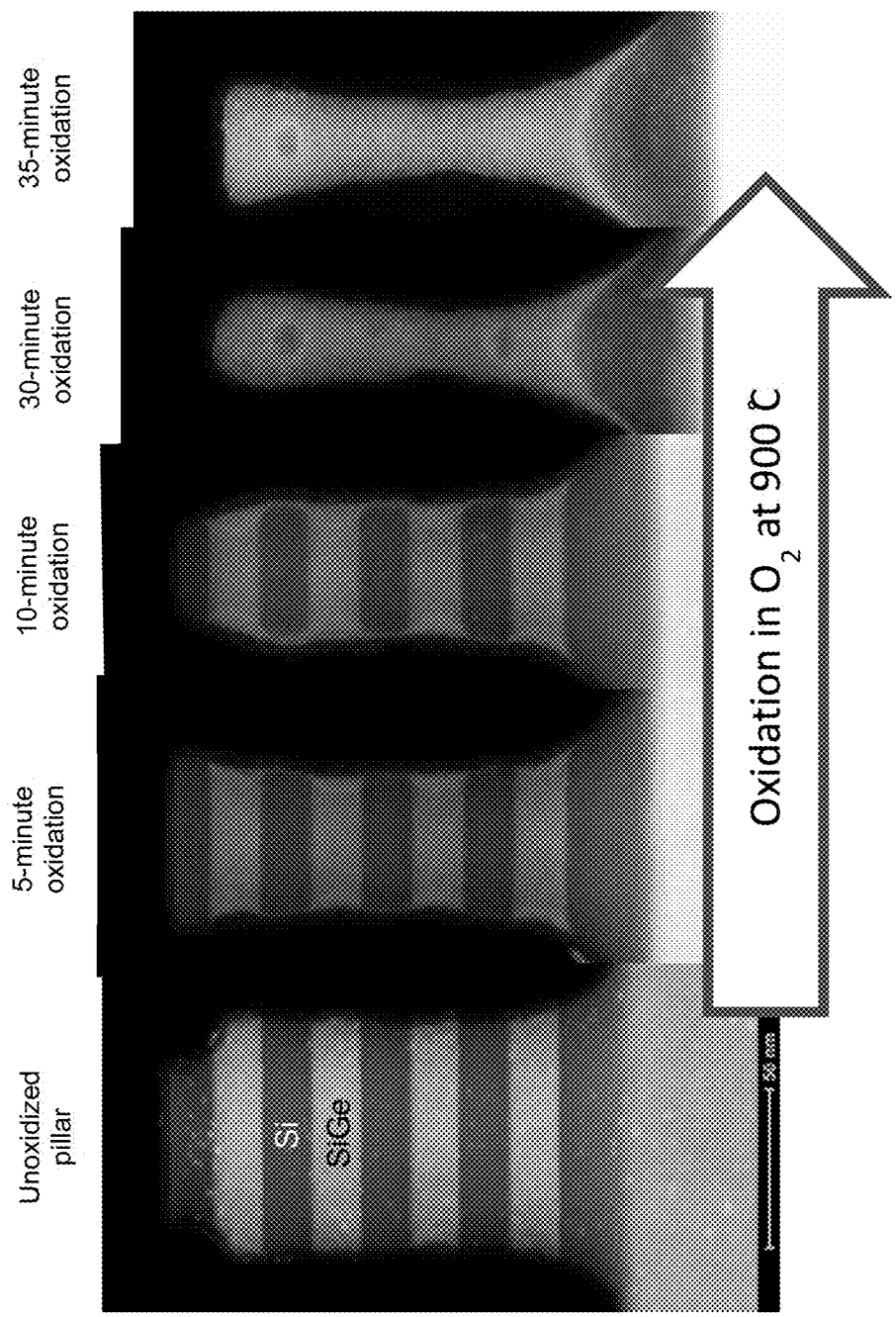
FIG. 3 shows STEM images of the evolution of a 75 nm pillar during oxidation in O$_2$ at 900° C.
Figure 4B:
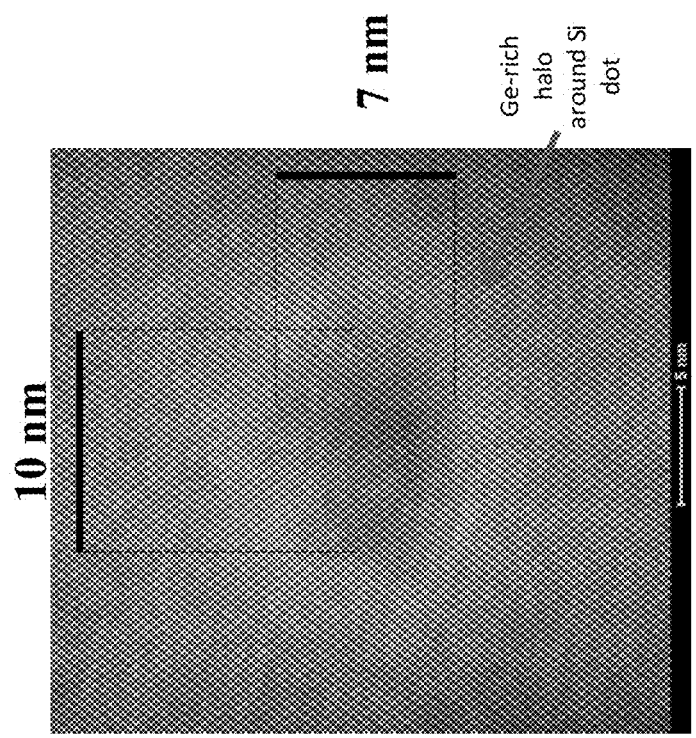
FIG. 4B is a high-resolution STEM image of the top embedded Si quantum dot.
Figure 4A:
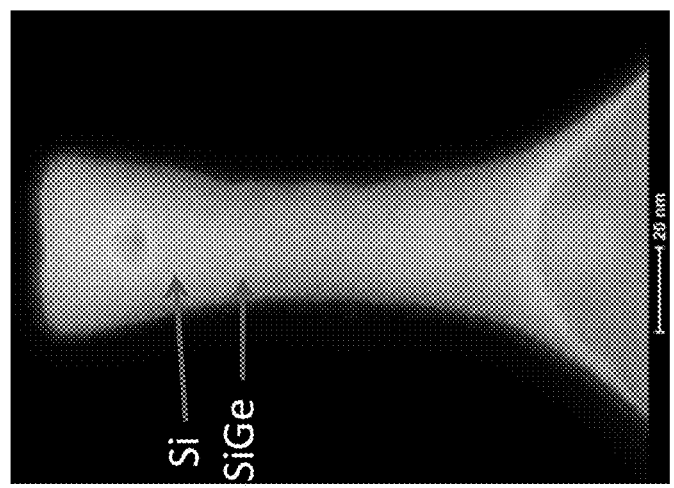
FIG. 4A is a STEM image of a 75 nm pillar after a 35-minute oxidation.
Figures 6A, 6B:
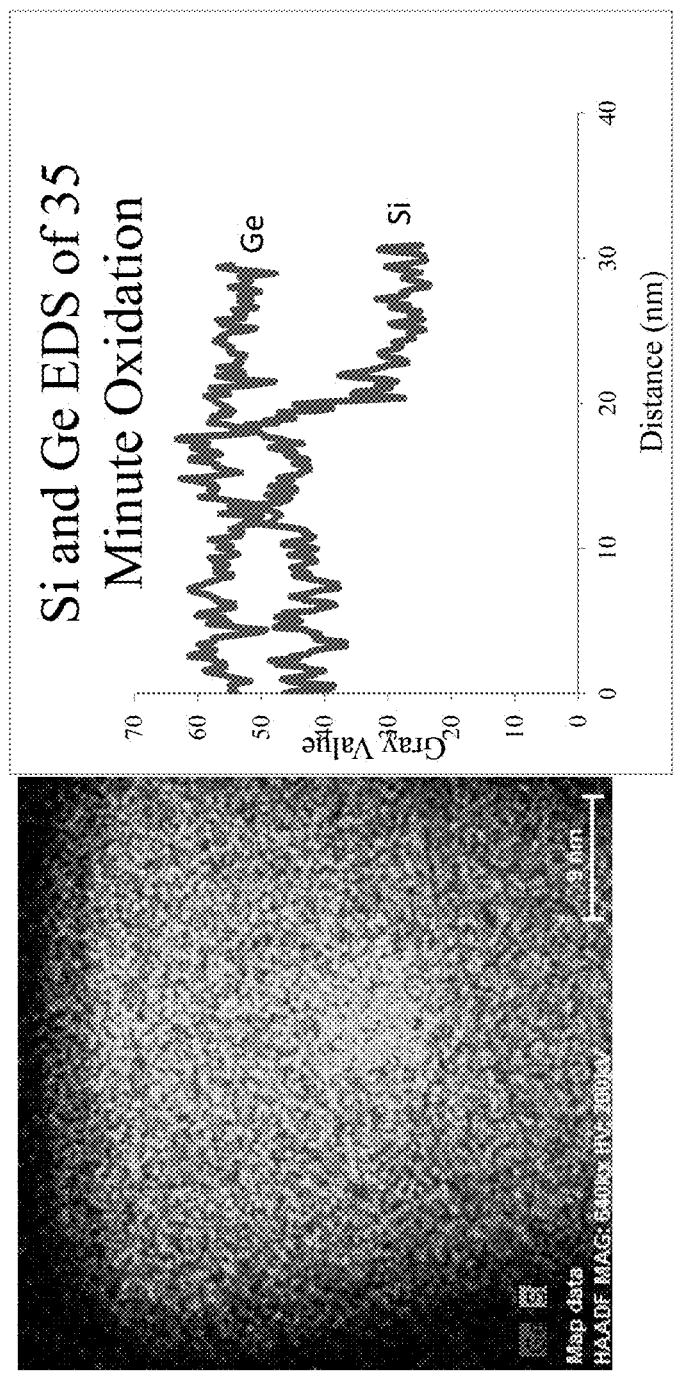
FIG. 6A is a high angle annular dark field (HAADF) image of the Si dot.
FIG. 6B shows Si and Ge energy dispersive X-ray spectroscopy (EDS) scans across the center of the dot.

The structural evolution of embedded nanostructures can be examined using cross-sectional high angle annular dark field scanning transmission electron microscopy (HAADF- STEM). In FIG. 3 are shown cross-sectional STEM images of 75 nm pillars oxidized at 900° C. in dry $O_2$ for a range of times. The images clearly show the enhanced vertical diffusion of Ge along the Si/SiO$_2$ interface, resulting in an embedded Si dot. FIGS. 4A and 4B are STEM images of a Si dot fully encapsulated by single crystal SiGe after 35-minute oxidation at 900° C. in 02. The embedded Si dot is less than 10 nm in diameter. FIG. 5A is a STEM image of the embedded Si dot (shown as the darker circular region). FIG. 5B is a greyscale intensity plot of the Si dot. FIG. 5C is a greyscale intensity plot across the center of the Si dot. The HAADF-STEM micrographs can be used to estimate the Ge concentration through Z-contrast analysis. See T. Grieb et al., *Ultramicroscopy* 184, 29 (2018). FIG. 6A is a HAADF image of the dot. FIG. 6B shows Si and Ge energy dispersive X-ray spectroscopy (EDS) scans across the center of the dot. The images indicate a Si-rich dot surrounded by a Ge-rich halo, or sphere. The Ge-rich sphere will have a larger Ge concentration than the surrounding SiGe, and therefore a smaller bandgap than both the surrounding single crystal SiGe and the embedded Si-rich dot. Therefore, the Ge-rich shell can be electronically and optically confined which can be useful for some applications.

Figure 7:
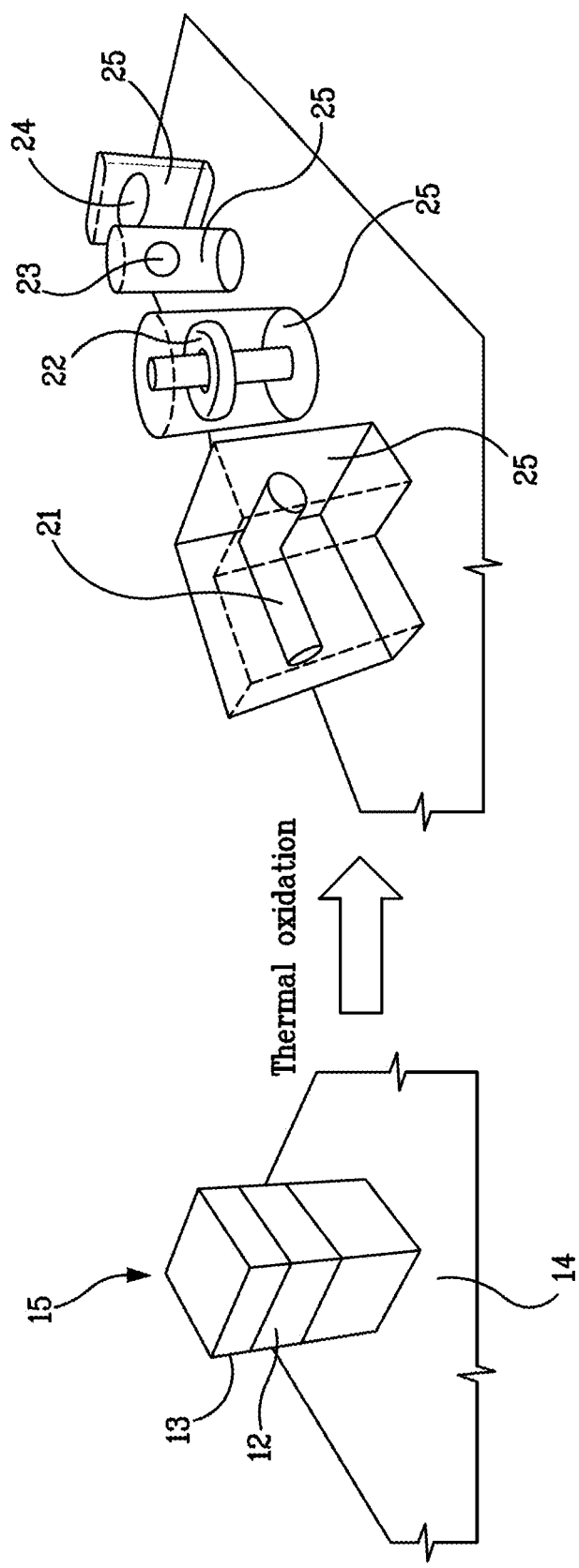
FIG. 7 shows a method to fabricate novel 3D quantum structures. Vertical pillars can be patterned with arbitrary cross-sections, such as a square (as shown), L, ring, circle, or oval. Subsequent thermal oxidation forms an embedded L, toroid, dot, or ellipsoid, respectively.

The enhanced Ge diffusion process enables a new method to create totally novel nano- and quantum-scale structures not achievable or previously demonstrated by other methods. FIG. 7 illustrates vertical Si/SiGe nanostructures with different and arbitrarily defined cross-sectional shapes. First, vertical 1-D Si/SiGe pillars 15 can be created by e-beam lithography and plasma etching of the patterned heterostructure, resulting in defined cross-sectional shapes, including square (as shown), 'L', ring, circle, or oval. These nanopillars 15 can then be thermally oxidized to drive the enhanced Ge diffusion process, resulting in encapsulated Si Ls 21, toroids 22, dots 23, or ellipsoids 24 surrounded by a SiGe alloy 25. These on-chip structures may exhibit novel shape-dependent physical properties, such as optical polarization.

Figure 8:
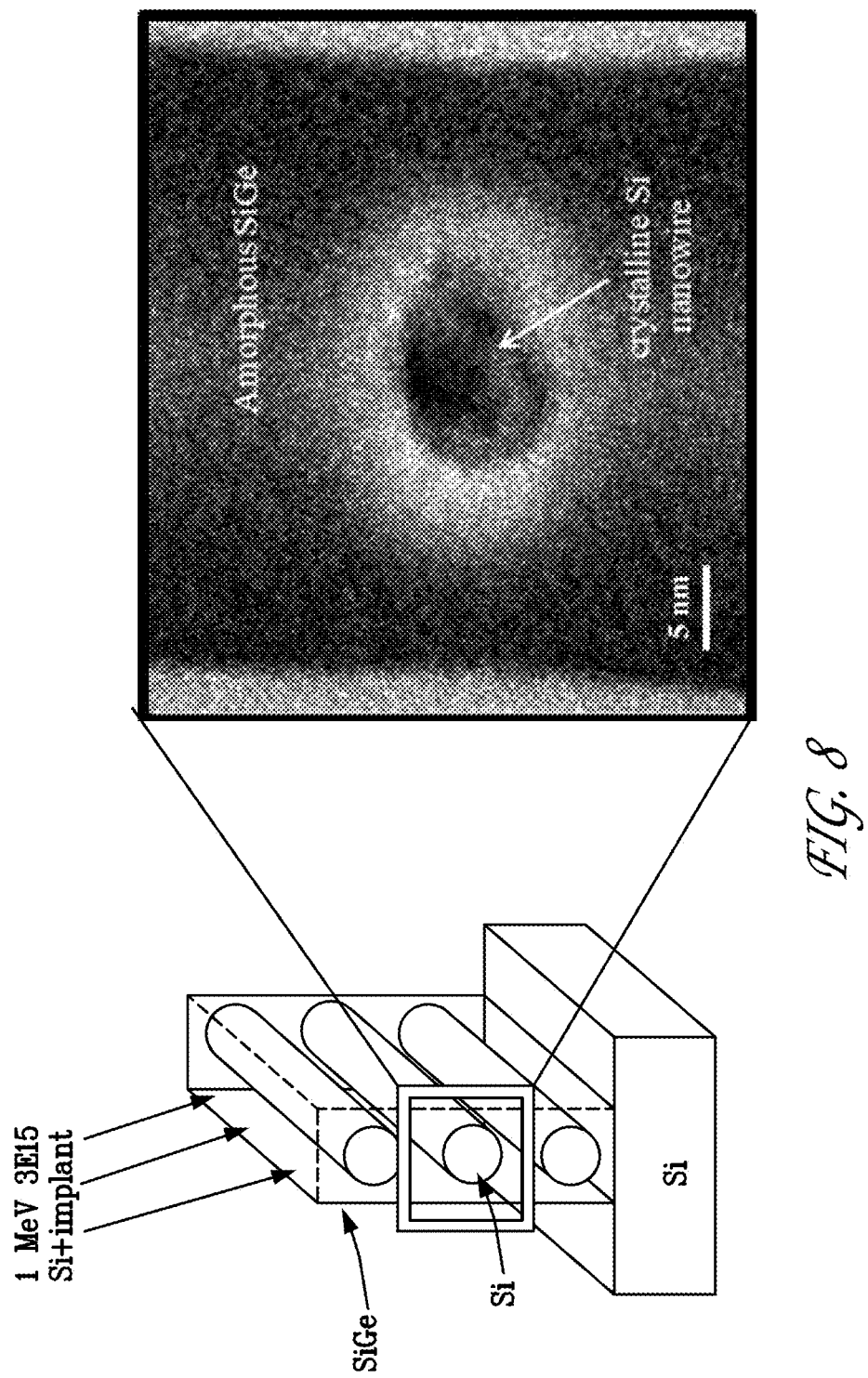
FIG. 8 is schematic illustration of Si ion implantation to amorphize SiGe.

The encapsulated nanostructures most easily created by this method are composed of a wider bandgap material (Si) surrounded by a narrower bandgap material (SiGe), which can present a challenge for use in applications requiring quantum or optical confinement. The bandgap can be modified by the selective amorphization of the surrounding single crystal SiGe using ion beam irradiation while leaving the Si crystalline, as shown in FIG. 8. Selective amorphization of SiGe in a Si/SiGe planar superlattice by Si ion irradiation has previously been demonstrated. See M. Vos et al., *Appl. Phys. Lett.* 58(9), 951 (1991). The SiGe alloy can be implanted with Si ions at doses that exceed the threshold damage density (TDD) for amorphization of SiGe but are below the TDD for Si. In particular, the dose can be below the threshold for forming stable extended defects in Si, and the sample can be annealed (up to 350° C.) to repair most of the Frenkel pair damage in the Si nanostructures without recrystallizing the amorphous SiGe. See Y. Tong et al., *Thin Solid Films* 291, 464 (1996). As amorphous $Si_{0.6}Ge_{0.4}$ has a significantly larger bandgap (~1.5 eV) compared to Si (1.1 eV), this enables confinement of the inner Si nanostructure by a wider bandgap amorphous outer SiGe material. Selective amorphization can thus serve as a method to engineer the Si/SiGe band structures to suit the desired application.

Figure 9:
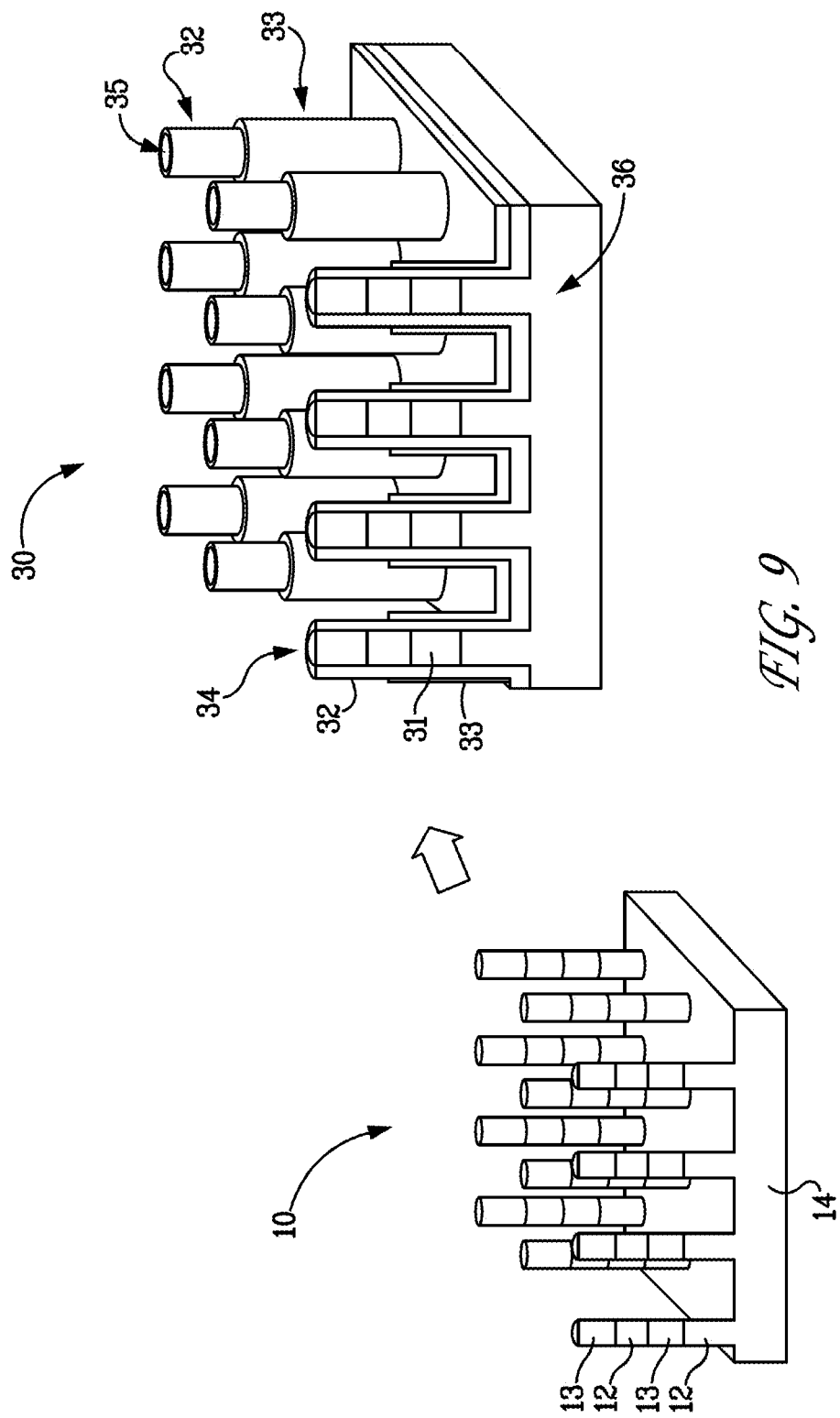
FIG. 9 is a schematic illustration of a SiGe quantum dot transistor.

The method enables novel microelectronics applications. FIG. 9 is a schematic illustration of a SiGe quantum dot single transistor 30, comprising an embedded SiGe quantum dot 31 for trapping an electron under a gate. See M. H. M. Van Weert et al., *Appl. Phys. Lett.* 96, 233122 (2010), which is incorporated herein by reference. A gate dielectric 32 and gate metal 33 can be deposited on the walls of the pillar 34 after formation of the SiGe quantum dot 31. The transistor can further comprise a source 35 and a drain 36. The method enables a surround-gated vertical nanowire quantum dot. Different quantum dot charge states can be accessed by tuning the gate voltage.

Figure 10:
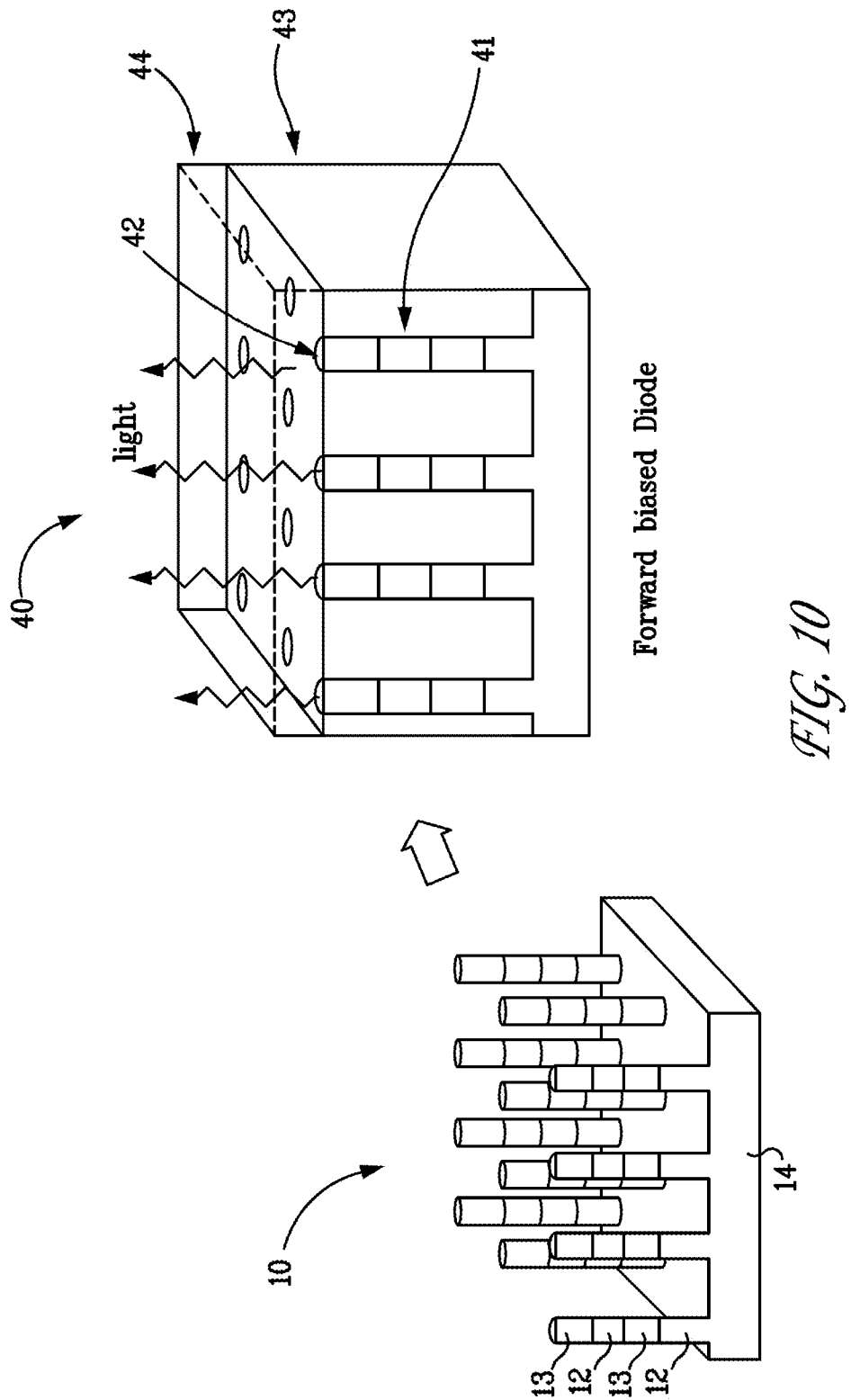
FIG. 10 is a schematic illustration of a Si quantum dot-based optical source.

The method also enables novel optical applications. FIG. 10 is a schematic illustration of a Si quantum dot-based optical source 40. The optical source 40 comprises an embedded direct gap Si quantum dot 41. The pillars 42 can be surrounded by insulating $SiO_2$ 43. Light can be extracted though an optically transparent, electrically conducting, top indium tin oxide (ITO) layer 44 enabling a forward-biased diode. Quantum dots potentially are robust, have large absorption cross-sections, and emission wavelengths that can be tuned by size, and thus offer optical and chemical advantages compared to current state-of-the art organic molecules. Silicon is non-toxic and abundant, thereby eliminating many of the drawbacks commonly found for the direct bandgap materials. At small enough sizes (e.g. <2.5 nm), Si nanowires have been theoretically predicted to transition from an indirect to a direct bandgap. See M. O. Baykan et al., *J. Appl. Phys.* 108(9), 1 (2010); and K. Dohnalova et al., *Light: Science and Applications* 2, e47 (2013). Therefore, direct bandgap Si/SiGe quantum-scale structures may enable a host of integrated all Si(Ge)-based photonics, including on-chip optical sources for interconnects, that could eliminate the current need for integrating III-V and Si(Ge) materials and devices.

The present invention has been described as a method for fabricating embedded nanostructures with arbitrary shape. It will be understood that the above description is merely illustrative of the applications of the principles of the present invention, the scope of which is to be determined by the claims viewed in light of the specification. Other variants and modifications of the invention will be apparent to those of skill in the art.

We claim:

1. A method for fabricating embedded nanostructures, comprising:
    providing a layered heterostructure, comprising alternating layers of at least two different semiconductors, wherein an atom species of one of the semiconductors has a faster diffusion rate along an oxidizing interface than a slower diffusing atom species of the other semiconductor at an oxidizing temperature;
    patterning the layered heterostructure to form a patterned heterostructure;
    removing portions of the patterned heterostructure to form a vertical heterostructure of arbitrary cross section; and
    oxidizing the vertical heterostructure at the oxidizing temperature to form embedded nanostructures having an arbitrary shape of the semiconductor having the slower diffusing atom species surrounded by the semiconductor having the faster diffusing atom species.

2. The method of claim 1, wherein the layered heterostructure comprises Si/SiGe.

3. The method of claim 2, wherein the layered heterostructure comprises at least one Si layer between SiGe layers.

4. The method of claim 2, wherein the embedded nanostructure comprises a embedded Si nanostructure surrounded by a SiGe.

5. The method of claim 4, wherein the embedded nanostructure comprises a Ge-rich cladding surrounding the embedded Si nanostructure.

6. The method of claim 4, further comprising implanting the surrounding SiGe with Si ions to amorphize the SiGe.

7. The method of claim 1, wherein the oxidizing comprises exposing the vertical pillars to $O_2$ at an oxidizing temperature greater than 800° C.

8. The method of claim 1, further comprising annealing the embedded nanostructures at an annealing temperature to at least partially remove the surrounding semiconductor.

9. The method of claim 8, wherein the annealing comprises exposing the embedded nanostructures to $O_2$ at an annealing temperature of greater than 500° C. and less than 800° C.

10. The method of claim 1, wherein the embedded nanostructure comprises an L, toroid, dot, or ellipsoid.

11. The method of claim 1, wherein the embedded nanostructure has a cross-sectional dimension of less than 10 nm.

\* \* \* \* \*